June 17, 1952 D. G. HOLLOWAY 2,600,873

BALANCED MODULATOR

Filed Oct. 23, 1950

INVENTOR
Dennis G. Holloway
By Ralph B. Stewart
Attorney

Patented June 17, 1952 2,600,873

UNITED STATES PATENT OFFICE 2,600,873

BALANCED MODULATOR

Dennis Godson Holloway, Taplow, England, assignor to British Telecommunications Research Limited, Taplow, England, a company of Great Britain Application October 23, 1950, Serial No. 191,531
In Great Britain November 4, 1949

2 Claims. (Cl. 332—43)

Figure 1:
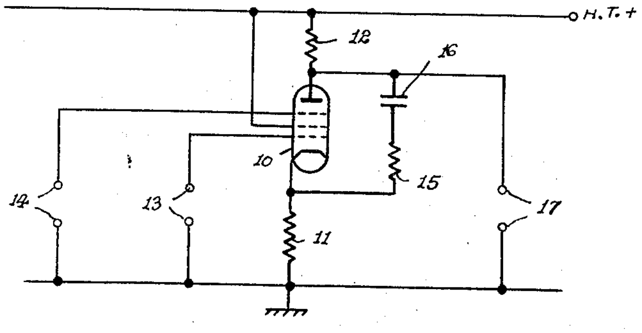

The present invention relates to balanced modulators, that is to say modulators of the type comprising means for applying a modulating voltage to vary the amplitude of a carrier oscillation, the arrangement being such that in the absence of the modulating voltage the carrier is suppressed or can be suppressed from the output of the modulator.

A known type of balanced modulator comprises two electron discharge valves, say triodes, the anodes of the two valves being connected in push-pull fashion. In this arrangement the carrier oscillation is applied to the control electrodes of the two valves in push-push and the modulating voltage is applied to the same control electrodes, or further electrodes, in push-pull.

Such modulators are sometimes used in telephony transmitters for the generation of sidebands with suppressed carrier. A further application is in the control of the amplitude of an oscillation by means of a direct control voltage. In this case when the control voltage is of zero amplitude so is the controlled oscillation, and increase in the amplitude of the control voltage results in increase of the amplitude of the controlled oscillation. Yet a further application is in the generation of "mark" or "space" frequencies in telegraph systems employing carrier-shift keying.

A known arrangement used in carrier-shift keying comprises a radio-frequency oscillator and an oscillator of lower frequency which is given either of two values in dependence upon keying voltages applied to a frequency-controlling device therein. The oscillation of lower frequency is applied to modulate the radio-frequency oscillation in a balanced-modulator in which the radio-frequency oscillation is suppressed. One of the sidebands is selected by a filter and amplified to provide the output oscillations of "mark" and "space" frequencies.

If such an arrangement is required to be operated over a substantial range of frequencies all tuned circuits in the arrangement are usually ganged. Where a number of tuned circuits are ganged it is normally convenient to arrange that one terminal of the capacitor in each circuit is at or near earth potential. When known balanced modulators are employed comprising two valves connected as previously described, the tuned circuits immediately associated with the modulator are balanced and hence both terminals of the capacitors therein are at substantial radio-frequency potential. Difficulty arises in tracking the balanced tuned circuits and the remaining circuits in which one terminal of the capacitor in each is at earth potential.

The principal object of the present invention is to provide an improved balanced modulator in which only one electron discharge valve need be used, whereby ageing of the valve or changes in supply voltages have substantially no effect on the balance of the modulator.

A further object of the invention is to provide a balanced modulator in which the carrier and modulation input circuits and the modulator output circuit can have a common terminal which may be connected to earth, that is to the actual earth or a mass of conducting material such as the chassis of a transmitter.

According to the present invention, a balanced modulator comprises an electron discharge device having a cathode, a primary collector electrode, a secondary collector electrode, a control electrode for controlling the total current flowing to the two collector electrodes, and means for controlling the division of current between the two collector electrodes, terminals for applying an oscillation to be modulated between the control electrode and cathode of the device, terminals for applying a modulating voltage to said means, a first load impedance element connected to the primary collector electrode, a second load impedance element connected to the cathode, a network connected between the primary collector electrode and the cathode, and an output terminal connected to a point on the network at which in the absence of the modulating voltage the amplitude of said oscillation is substantially zero. The electron discharge device may conveniently be a pentode valve, in which case the primary collector electrode may be the anode, the secondary collector electrode the screen grid, and the means for controlling the division of current the suppressor grid. The network connected between the primary collector electrode and the cathode may take one of many forms and in the simplest case may be constituted by a single impedance element.

Figure 2:
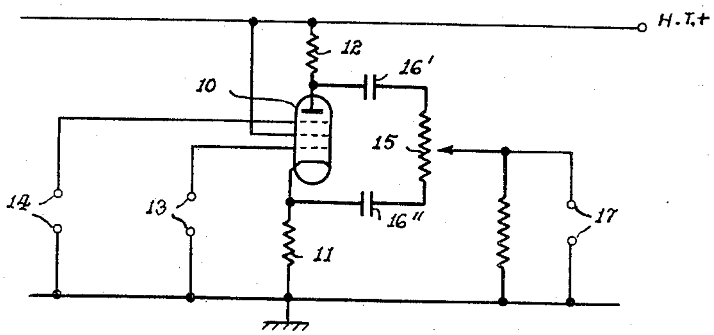
Figure 3:
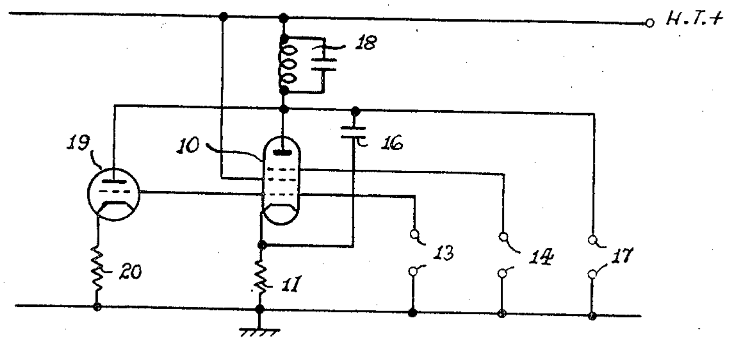

Three embodiments of the invention will now be described by way of example with reference to the accompanying drawing, in which:

Figs. 1, 2 and 3 are theoretical circuit diagrams of the three embodiments respectively.

In Fig. 1 a pentode valve 10 has its cathode connected to earth through a load resistor 11 and its anode connected through a load resistor 12 to the positive terminal H. T.+ of a source (not shown) of high tension voltage whose negative terminal is connected to earth. The screen grid of the valve is connected directly to the terminal H. T.+, and a carrier oscillation is applied to input terminals 13 connected to the control grid of the valve and earth respectively. A modulating voltage is applied to terminals 14 connected to the suppressor grid and earth respectively.

In this arrangement the control grid controls the total current flowing in the valve, and the division of current between the anode and screen grid can be varied by varying the potential of the suppressor grid. Assuming that no modulating voltage is applied to the suppressor grid and that the carrier is applied to the control grid, slightly more current at the carrier frequency will flow in the cathode resistor 11 than in the anode resistor 12. The cathode is connected to the anode through a resistor 15 and capacitor 16. The capacitor 16 is arranged to have negligible reactance at the carrier frequency and the resistor 15 is arranged to have a value such that the amplitude of current at carrier frequency flowing in the resistor 11 from the cathode equals that flowing through the resistor 12 from the anode. As these currents are in anti-phase cancellation takes place and hence there is zero potential variation at the anode of the valve. Output terminals 17 are connected therefore to the anode of the valve and earth respectively.

These conditions prevail so long as no potential variation of the suppressor grid takes place. On applying a modulating voltage to the suppressor grid the division of current between the anode and screen grid is varied in accordance with the changes in amplitude and sign of the modulating voltage. At all modulating voltages other than zero cancellation of the cathode and anode current in the resistor 12 is no longer achieved.

It will be appreciated, therefore, that by suitably biasing the control and suppressor grids it can be arranged that the application of an alternating voltage to the suppressor grid results in the production of sidebands of the carrier, the carrier being suppressed. Alternatively it may be arranged that a linear variation in the amplitude of the carrier arises from a variation in the amplitude of a direct control voltage applied to the suppressor grid. It is necessary in this case to arrange the bias on the suppressor grid to be such that the variation in the direct control voltage takes place over a linear part of the curve showing the relationship of anode current to suppressor grid voltage.

Where the carrier frequency is low it may be difficult to eliminate a phase change in the current flowing from the cathode to the anode through the network 15, 16. This difficulty may be overcome by the use of an arrangement as shown in Fig. 2. The capacitor 16 of Fig. 1 is divided into two parts 16′ and 16″ connected as shown to the anode and cathode respectively of the valve 10. The resistor 15 is connected between the two capacitors and the output terminal 17 previously connected to the anode of the valve is connected to a tapping on the resistor 15 at which balance is obtained in the absence of a modulating voltage.

It will be understood that the peak output voltage level of the arrangements shown in Figs. 1 and 2 must be slightly less than the peak level of the carrier applied at the terminals 13 owing to the negative feedback provided by the cathode resistor 11. It could be arranged to increase the gain of the modulator by applying the carrier directly between the control grid and cathode of the valve 10 instead of between the control grid and earth. In this case, however, the input and output circuits no longer have a common terminal.

Where it is desired to maintain balance over a range of carrier frequencies of high radio frequency an arrangement as shown in Fig. 3 is preferred. The resistor 12 of Figs. 1 and 2 is replaced by a tuned circuit 18, the resistor 15 is dispensed with and an additional valve 19 is provided. The valve 19 may be, for example, a triode as shown and has its anode, control grid and cathode connected to the anode, control grid and cathode respectively of the valve 10. The anode current of the valve 19 is arranged to be equal to the screen current of the valve 10 in the absence of a modulating voltage. This may be achieved in any suitable manner, for example by the use of a cathode resistor 20 of convenient value. The reactance of the capacitor 16 is, as previously stated, of negligible value, and hence the currents flowing in the circuit 18 from the anode and cathode of the valve 10 cancel one another.

It will be understood that two arrangements as shown in Figs. 1, 2 or 3 could be arranged in push-pull-push-push connection if desired, whereby any residual carrier oscillation may conveniently be suppressed. In arranging the two modulators in this way, the anodes of the two valves in the modulators respectively, are connected in push-pull, the modulation input circuits are also arranged in push-pull, and the carrier input circuits are arranged in push-push.

I claim:

1. A balanced modulator comprising an electron discharge device having a cathode, a primary collector electrode, a secondary collector electrode, a control electrode to control the total current flowing to the two said collector electrodes, and means to control the division of said total current between the said collector electrodes, a carrier oscillation input terminal connected to said control electrode, a modulating voltage input terminal connected to said means, a first load impedance element connected to said primary collector electrode, a second load impedance element connected to said cathode, a second electron discharge device having an anode, a cathode and at least one control electrode, a connection between the cathodes, and a connection between the control electrodes of said discharge devices, a connection between the primary collector electrode of the first-named electron dicharge device and the anode of said second electron discharge device, a capacitor of substantially zero reactance at the frequency of said carrier oscillations connected between the cathode and primary collector electrode of the first-named electron discharge device, and an output terminal connected to the primary collector electrode of the first-named electron discharge device.

2. A balanced modulator as claimed in claim 1, wherein said first load impedance element is a circuit resonant at the frequency of said carrier oscillation.

DENNIS GODSON HOLLOWAY.

REFERENCES CITED

The following references are of record in the file of this patent:

UNITED STATES PATENTS

| Number | Name | Date |
|---|---|---|
| 2,211,939 | Steimel et al. | Aug. 20, 1940 |
| 2,498,526 | Bucher | Feb. 21, 1950 |
| 2,504,469 | Tillman | Apr. 18, 1950 |
| 2,521,443 | Blok et al. | Sept. 5, 1950 |